(12) United States Patent
Eggers

(10) Patent No.: US 10,234,523 B2
(45) Date of Patent: Mar. 19, 2019

(54) MRI WITH DIXON-TYPE WATER/FAT SEPARATION WITH ESTIMATION OF THE MAIN MAGNETIC FIELD VARIATIONS

(71) Applicant: KONINKLIJKE PHILIPS N.V., Eindhoven (NL)

(72) Inventor: Holger Eggers, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 236 days.

(21) Appl. No.: 15/104,543

(22) PCT Filed: Dec. 19, 2014

(86) PCT No.: PCT/EP2014/078755
§ 371 (c)(1),
(2) Date: Jun. 15, 2016

(87) PCT Pub. No.: WO2015/091956
PCT Pub. Date: Jun. 25, 2015

(65) Prior Publication Data
US 2016/0313423 A1    Oct. 27, 2016

(30) Foreign Application Priority Data
Dec. 19, 2013  (EP) ..................................... 13198292

(51) Int. Cl.
*G01R 33/48* (2006.01)
*G01R 33/56* (2006.01)
*G01R 33/565* (2006.01)

(52) U.S. Cl.
CPC ..... *G01R 33/4828* (2013.01); *G01R 33/5608* (2013.01); *G01R 33/56563* (2013.01)

(58) Field of Classification Search
CPC ............ G01R 33/4828; G01R 33/5608; G01R 33/56563
See application file for complete search history.

(56) References Cited

U.S. PATENT DOCUMENTS

| 8,027,713 | B2 | 9/2011 | Yatsui | |
| 2010/0156415 | A1* | 6/2010 | Keupp | ................ G01R 33/485 324/309 |

(Continued)

FOREIGN PATENT DOCUMENTS

WO    2011080693 A1    7/2011

OTHER PUBLICATIONS

Yu H et al: "Robust Field Map Estimation in a Dixon Water-Fat Separation Algorithm with Short Echo Time Increments", Proceedings of the International Society for Magnetic Resonance in Medicine, 12th Annual Meeting and Exhibition, Kyoto,Japan, May 15-21, 2004,vol. 11 , May 1, 2004 (May 1, 2004), p. 345.

(Continued)

*Primary Examiner* — Dixomara Vargas
*Assistant Examiner* — Zannatul Ferdous

(57) ABSTRACT

MR imaging of at least two chemical species having different MR spectra provides a Dixon water/fat separation that avoids swaps of water and fat signals in the reconstructed MR images due to large gradients of the main magnetic field $B_0$. The method includes the steps of: a) generating echo signals at different echo times by subjecting an object (10) positioned in a main magnetic field to a multi-echo imaging sequence of RF pulses and switched magnetic field gradients; b) acquiring the echo signals; c) correcting the acquired echo signals by virtual shimming. The vertical shimming includes reconstructing single echo images from the echo signals; selecting a number of voxel positions; fitting a given mathematical function, which reproduces the spatial variation of the main magnetic field, to the echo time-dependent phase evolution of the single echo image values at the selected voxel positions; and demodulating the single echo images according to the spatial variation of the main magnetic field as reproduced by the mathematical function. In (Continued)

this manner, signal contributions of the at least two chemical species are separated on the basis of the demodulated single echo images.

13 Claims, 2 Drawing Sheets

(56) References Cited

U.S. PATENT DOCUMENTS

| | | | |
|---|---|---|---|
| 2011/0091090 A1 | 4/2011 | Dahlqvist Leinhard et al. | |
| 2011/0254547 A1 | 10/2011 | Reeder et al. | |
| 2012/0054547 A1 | 3/2012 | Nussbaum et al. | |
| 2015/0042334 A1* | 2/2015 | Kannengiesser | G01R 33/3664 324/309 |

OTHER PUBLICATIONS

Samir D. Sharma et al: "Accelerated water-fat imaging using restricted subspace field map estimation and compressed sensing". Magnetic Resonance in Medicine,vol. 67, No. 3, Jun. 28, 2011 (Jun. 28, 2011), pp. 650-659.

Wenmiao Lu et al: "Jigsaw: Joint Inhomogeneity Estimation via Global Segment Assembly for Water-Fat Separation",IEEE Transactions on Medical Imaging, IEEE Service Center, Piscataway, NJ, US, vol. 30, No. 7, Jul. 1, 2011 (Jul. 1, 2011),pp. 1417-1426.

Alanen A et al:"Determination of fat content of burbot (Lota lota) liver with low field MR imaging (0.04 T)", Physics in Medicine and Biology, Institute of Physics Publishing, Bristol GB, vol. 36, No. 7, Jul. 1, 1991 (Jul. 1, 1991),pp. 953-961.

Zhan J et al: "Improving image contrast and water/fat quantitation in Dixon methods using a multi-spectral fat model",Proceedings of the International Society for Magnetic Resonance in Medicine, 12th Scientific Meeting and Exhibition, Kyoto,Japan, May 15-21, 2004, International Society for Magnetic Resonance in Medicine, Berkeley, CA; US,vol. 11, May 15, 2004 (May 15, 2004), p. 2135.

Hernando D et al: "Robust water/fat separation in the presence of large field inhomogeneities using a graph cut algorithm".Magnetic Resonance in Medicine, Academic Press, Duluth, MN, US, vol. 63, No. 1, Oct. 26, 2009 (Oct. 26, 2009), pp. 79-90.

Qing-San Xiang: "Improved Single Point Water-Fat Imaging with Virtual Shimming",Proceedings of the International Society for Magnetic Resonance in Medicine, 9th Annual Meeting and Exhibition, Apr. 21-27, 2001,vol. 9, Apr. 21, 2001 (Apr. 21, 2001), p. 789.

* cited by examiner

MRI WITH DIXON-TYPE WATER/FAT SEPARATION WITH ESTIMATION OF THE MAIN MAGNETIC FIELD VARIATIONS

CROSS REFERENCE TO RELATED APPLICATIONS

This application is a U.S. national phase application of International Application No. PCT/EP2014/078755, filed on Dec. 19, 2014, which claims the benefit of EP Application Ser. No. 13198292.8 filed on Dec. 19, 2013 and is incorporated herein by reference.

FIELD OF THE INVENTION

The invention relates to the field of magnetic resonance (MR) imaging. It concerns a method of MR imaging of a portion of a body placed in the examination volume of a MR device. The invention also relates to a MR device and to a computer program to be run on a MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MR method in general, the body of the patient to be examined is arranged in a strong, uniform magnetic field $B_0$ whose direction at the same time defines an axis (normally the z-axis) of the co-ordinate system on which the measurement is based. The magnetic field $B_0$ produces different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse), so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the spins are deflected from the z axis to the transverse plane (flip angle 90°).

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second time constant $T_2$ (spin-spin or transverse relaxation time). The variation of the magnetization can be detected by means of receiving RF coils which are arranged and oriented within an examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneities) from an ordered state with the same phase to a state in which all phase angles are uniformly distributed (dephasing). The dephasing can be compensated by means of a refocusing pulse (for example a 180° pulse). This produces an echo signal (spin echo) in the receiving coils.

In order to realize spatial resolution in the body, constant magnetic field gradients extending along the three main axes are superposed on the uniform magnetic field $B_0$, leading to a linear spatial dependency of the spin resonance frequency. The signal picked up in the receiving coils then contains components of different frequencies which can be associated with different locations in the body. The signal data obtained via the receiving coils correspond to the spatial frequency domain and are called k-space data. The k-space data usually include multiple lines acquired with different phase encoding. Each line is digitized by collecting a number of samples. A set of k-space data is converted to an MR image by means of Fourier transformation.

In MR imaging, it is often desired to obtain information about the relative contribution of different chemical species, such as water and fat, to the overall signal, either to suppress the contribution of some of them or to separately or jointly analyze the contribution of all of them. These contributions can be calculated if information from two or more corresponding echoes, acquired at different echo times, is combined. This may be considered as chemical shift encoding, in which an additional dimension, the chemical shift dimension, is defined and encoded by acquiring a couple of images at slightly different echo times. In particular for water/fat separation, these types of experiments are often referred to as Dixon-type of measurements. By means of Dixon imaging or Dixon water/fat imaging, a water/fat separation can be achieved by calculating contributions of water and fat from two or more corresponding echoes, acquired at different echo times. In general such a separation is possible because there is a known precessional frequency difference of hydrogen in fat and water. In its simplest form, water and fat images are generated by either addition or subtraction of 'in phase' and 'out of phase' datasets in the so-called 2-point Dixon technique. The retrospective separation of the contributions from the different chemical species to the acquired, composite MR signals in Dixon-type MR imaging commonly relies on a smooth spatial variation of the main magnetic field $B_0$. This general assumption is typically violated near large susceptibility gradients within the examination volume and also at locations remote from the iso-center of the main magnet coil of the used MR device.

Moreover, actual or apparent large gradients of the main magnetic field $B_0$ may arise from poor shimming and from low or no signal magnitude at certain image positions. Such imperfections of the main magnetic field $B_0$ may cause the retrospective separation of the signal contributions from the different chemical species to 'swap', with the consequence that signal contributions from fat wrongly appear in the water image and vice versa.

The European patent application EP 1 380 257 (see also U.S. Pat. No. 8,027,713) discloses an MRI apparatus in which the inhomogeneity of the static magnetic field is derived from unwrapped phase values of acquired data at various echo times.

SUMMARY OF THE INVENTION

From the foregoing it is readily appreciated that there is a need for an improved MR imaging technique. It is an object of the invention to provide a Dixon water/fat separation technique that avoids swaps of water and fat signals in the reconstructed MR images due to large gradients of the main magnetic field $B_0$.

In accordance with the invention, a method of MR imaging of at least two chemical species having different MR spectra is disclosed. The method of the invention comprises the steps of:

a) generating echo signals at different echo times by subjecting an object positioned in a main magnetic field to an imaging sequence of RF pulses and switched magnetic field gradients;
b) acquiring the echo signals;
c) correcting the acquired echo signals by virtual shimming, which comprises:
   reconstructing single echo images from the echo signals;
   selecting a number of voxel positions;
   fitting a given mathematical function, which reproduces the spatial variation of the main magnetic field, to the echo time-dependent phase evolution of the single echo image values at the selected voxel positions;
   demodulating the single echo images according to the spatial variation of the main magnetic field as reproduced by the mathematical function; and
d) reconstructing a MR image, wherein signal contributions of the at least two chemical species are separated on the basis of the demodulated single echo images.

The invention addresses the above described limitations of conventional Dixon-type MR techniques. The present invention aims at eliminating the swaps of water and fat signals. It suggests an automatic virtual shimming step, which removes large gradients in the main magnetic field $B_0$ before the separation of signal contributions from the different chemical species. The invention thus renders the separation more robust.

Unlike in real physical shimming of the main magnetic field, the virtual shimming of the invention is performed as a mere post-processing step and does require neither additional scan time nor additional hardware components of the used MR apparatus.

The step of virtual shimming relies on the selection of a sub-set of voxels according to certain criteria (discussed in more detail below) and on the fitting of a pre-defined mathematical function to the echo time-dependent phase evolution of the (complex) single echo image values at the selected voxel positions, such that the fitted mathematical function approximates the spatial variation of the main magnetic field within the examination volume. The voxels are preferably selected such that the phase evolution over echo time at the respective voxel positions can be expected to essentially reflect the spatial variation of the main magnetic field. The spatial variation of the main magnetic field as emulated by the fitted mathematical function is then used to demodulate the single echo images in order to eliminate most of the influence of the main magnetic field inhomogeneity on the echo time-dependent phase evolution at all voxel positions. In other words, the invention uses the mathematical function fitted to the single echo images at the selected voxel positions to predict the inhomogeneity-induced phase evolution of the signals also at the other voxel positions.

Finally, the separation of the contributions from the different chemical species is performed according to the invention from the demodulated single echo images (or the corresponding k-space data), wherein the echo time-dependent phase evolution of the demodulated signals is attributed to the (a priori known) frequency differences of the chemical species and, where applicable, residual inhomogeneity of the main magnetic field.

In a preferred embodiment of the invention, the mathematical function is a polynomial in the spatial coordinates, such as, e.g., a linear function or a parabolic function along any of the three orthogonal coordinate axes. Such a mathematical function is well-suited to emulate a spatial variation of the main magnetic field as it is commonly addressed by additional hardware components of the used MR apparatus for local or global, linear or higher order shimming.

According to a further preferred embodiment of the invention, the criterion for the selection of the voxel positions for virtual shimming is that the single echo images contain only signal contributions from one of the chemical species (e.g. water protons) at the respective voxel positions. In this way it can be made sure that the phase evolution over echo time at the respective voxel positions reflects the spatial variation of the main magnetic field and is not disturbed by other effects influencing the signal phasing. Hence, the fitted mathematical function will reliably approximate the true spatial variation of the main magnetic field within the examination volume.

According to a further preferred embodiment, the selection of the voxel positions in the virtual shimming step involves elimination of voxels having a signal magnitude above a given maximum value and/or below a given minimum value. In this way, voxels with a too small signal magnitude are excluded as probably unreliable because of an insufficient signal-to-noise ratio. Voxels with a too high signal magnitude can be expected to contain mainly signal contributions from fat and should thus also be excluded. This selection can be performed fast and simply by a histogram analysis of the single echo images.

According to yet a further preferred embodiment, the selection of the voxel positions involves elimination of voxels showing a variation of the signal magnitude as a function of echo time above a given maximum threshold value. This means, in other words, that voxels with a too strong variation of the signal magnitude over echo time are excluded, because these voxels are deemed to contain significant signal contributions from both water and fat.

By combining the exclusion of voxels with either a too small signal magnitude or a too high signal magnitude with the exclusion of voxels with a too strong variation of the signal magnitude over echo time, the vast majority of the remaining voxels, which are selected according to the invention for the fitting procedure, should contain only signal contributions from hydrogen in water. These voxels can be used advantageously for a reliable determination of the spatial variation of the main magnetic field within the examination volume.

During the signal separation step according to the invention, a spectral model for the different chemical species may be employed. Such model may approximate the fat spectrum by a single, dominant peak. However, this simple model may fail to provide an efficient fat suppression. This is because hydrogen atoms in fat are known to comprise multiple spectral peaks. It is also possible in accordance with the invention that the spectrum of one of the chemical species is modeled, for example, by a multi-peak spectral model, while another chemical species (for example water protons) may simply be modeled by a single-peak spectrum.

It has to be noted that the term 'chemical species' has to be broadly interpreted in the context of the invention as any kind of chemical substance or any kind of nuclei having MR properties. In a simple example, the MR signals of two chemical species are acquired, wherein the chemical species are protons in the 'chemical compositions' water and fat. In a more sophisticated example, a multi-peak spectral model actually describes nuclei in a set of different chemical compositions which occur in known relative amounts.

The method of the invention described thus far can be carried out by means of a MR device including at least one main magnet coil for generating a uniform, steady magnetic field $B_0$ within an examination volume, a number of gradient coils for generating switched magnetic field gradients in different spatial directions within the examination volume, at least one body RF coil for generating RF pulses within the examination volume and/or for receiving MR signals from a body of a patient positioned in the examination volume, a control unit for controlling the temporal succession of RF pulses and switched magnetic field gradients, and a reconstruction unit for reconstructing MR images from the received MR signals. The method of the invention can be implemented by a corresponding programming of the reconstruction unit and/or the control unit of the MR device.

The method of the invention can be advantageously carried out on most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF THE EMBODIMENTS

Figure 1:
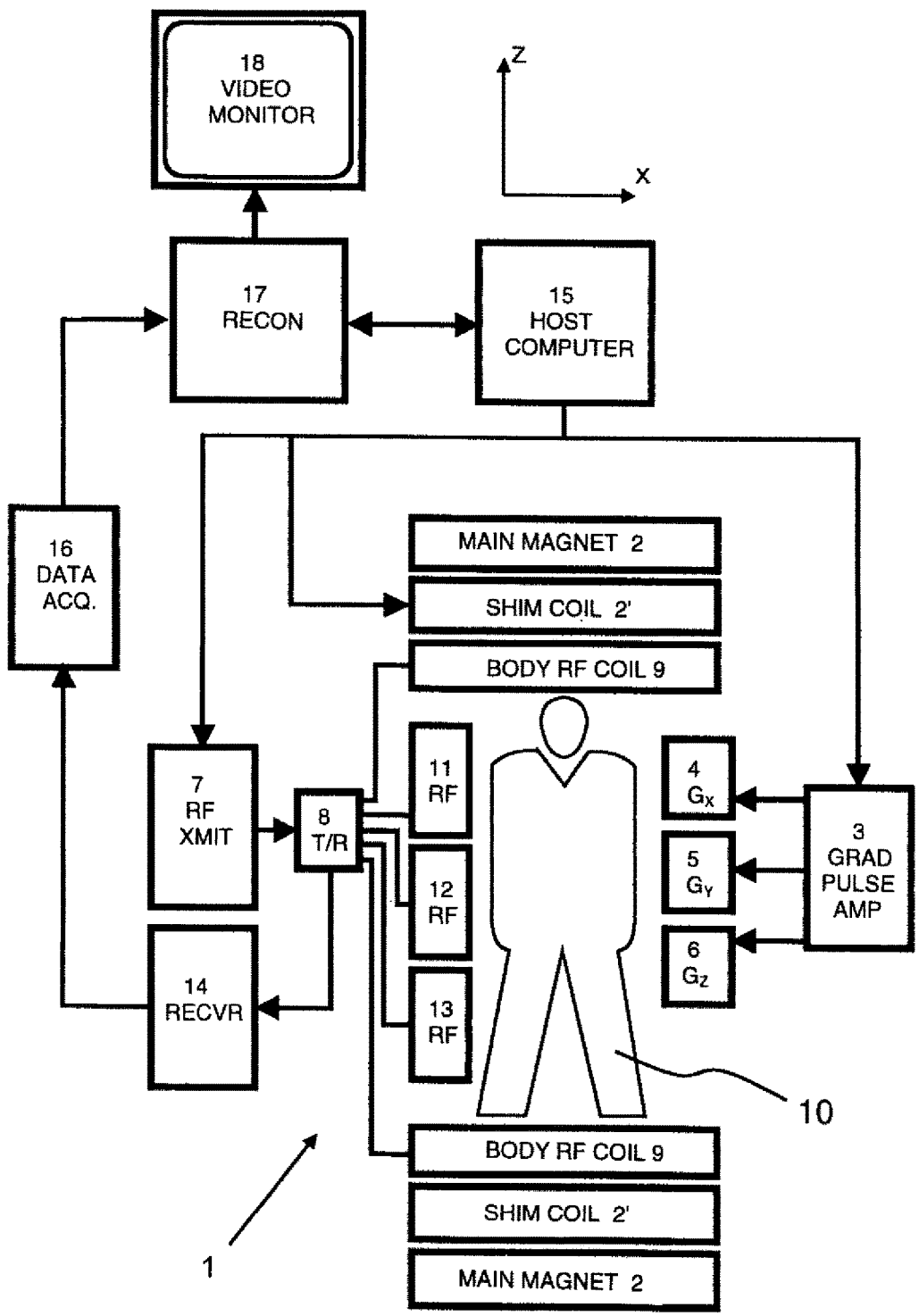
FIG. 1 shows a MR device for carrying out the method of the invention.

With reference to FIG. 1, a MR device 1 is shown. The device comprises superconducting or resistive main magnet coils 2 such that a substantially uniform, temporally constant main magnetic field $B_0$ is created along a z-axis through an examination volume. The device further comprises a set of ($1^{st}$, $2^{nd}$, and—where applicable—$3^{rd}$ order) shimming coils 2', wherein the current flow through the individual shimming coils of the set 2' is controllable for the purpose of minimizing $B_0$ deviations within the examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

More specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send-/receive switch 8, to a body RF coil 9 to transmit RF pulses into the examination volume. A typical MR imaging sequence is composed of a packet of RF pulse segments of short duration which, together with any applied magnetic field gradients, achieve a selected manipulation of nuclear magnetic resonance. The RF pulses are used to saturate, excite resonance, invert magnetization, refocus resonance, or manipulate resonance and select a portion of a body 10 positioned in the examination volume. The MR signals are also picked up by the body RF coil 9.

For generation of MR images of limited regions of the body 10, e.g. by means of parallel imaging, a set of local array RF coils 11, 12, 13 are placed contiguous to the region selected for imaging. The array coils 11, 12, 13 can be used to receive MR signals induced by body-coil RF transmissions.

The resultant MR signals are picked up by the body RF coil 9 and/or by the array RF coils 11, 12, 13 and demodulated by a receiver 14 preferably including a pre-amplifier (not shown). The receiver 14 is connected to the RF coils 9, 11, 12 and 13 via send-/receive switch 8.

A host computer 15 controls the shimming coils 2' as well as the gradient pulse amplifier 3 and the transmitter 7 to generate any of a plurality of MR imaging sequences, such as echo planar imaging (EPI), echo volume imaging, gradient and spin echo imaging, fast spin echo imaging, and the like. For the selected sequence, the receiver 14 receives a single or a plurality of MR data lines in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data.

Ultimately, the digital raw image data are reconstructed into an image representation by a reconstruction processor 17 which applies a Fourier transform or other appropriate reconstruction algorithms, such as SENSE or SMASH. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

In an embodiment of the invention, echo signals are generated at different echo times by means of a multi gradient echo imaging sequence. Depending on the respective echo time, the contributions of water and fat spins to the echo signals are more out of phase or more in phase. A plurality of echo signals is generated and acquired with appropriate phase encoding in a common fashion in order to be able to reconstruct a complete MR image of the desired field-of-view.

Figure 2:
FIG. 2 shows a slice of a single echo image reconstructed in accordance with the invention.

As a next step, single echo images are reconstructed from the echo signals, wherein each single echo image is attributed to one echo time. FIG. 2 shows one such single echo image.

Figure 3:
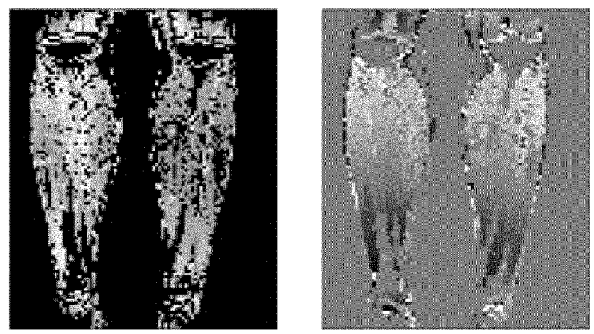
FIG. 3 shows the magnitude (left) and the phase (right) of selected voxels of the single echo image of FIG. 2.

FIG. 3 shows magnitude and phase images of the single echo image shown in FIG. 2.

For virtual shimming according to the invention, a number of voxels of the single echo images are selected, using criteria based on the absolute and relative signal magnitudes at the different echo times. Voxels with either a too small signal magnitude, which are deemed to be unreliable because of an insufficient signal-to-noise ratio, or a too high signal magnitude, which are deemed to contain mostly signal contributions from fat, are excluded based on a histogram analysis. Moreover, voxels with a too strong variation of the signal magnitude over echo time, which are deemed to contain signal contributions from both water and fat, are excluded. In this way, the vast majority of the remaining pixels contain signal contributions only from water. Only the voxels selected in this manner are shown in FIG. 3.

For the selected voxels, the phase differences between the single echo images are calculated (and optionally unwrapped). A given mathematical function, such as a linear or quadratic function along any of the three orthogonal spatial directions, is fitted to these echo time-dependent phase differences. The mathematical function is chosen to reproduce the spatial variation of the main magnetic field $B_0$ as it is commonly addressed by additional hardware components of the used MR apparatus for local or global, linear or higher order $B_0$ shimming.

The result of the fitting procedure is a $B_0$ map, which is then used to demodulate the single echo images in order to eliminate most of the influence of the main magnetic field inhomogeneity on the echo time-dependent phase evolution at all voxel positions. Hence, the invention uses the mathematical function fitted to the single echo images at the selected voxel positions to predict the inhomogeneity-induced phase evolution of the signals also at the other voxel positions.

Figures 4, 5:
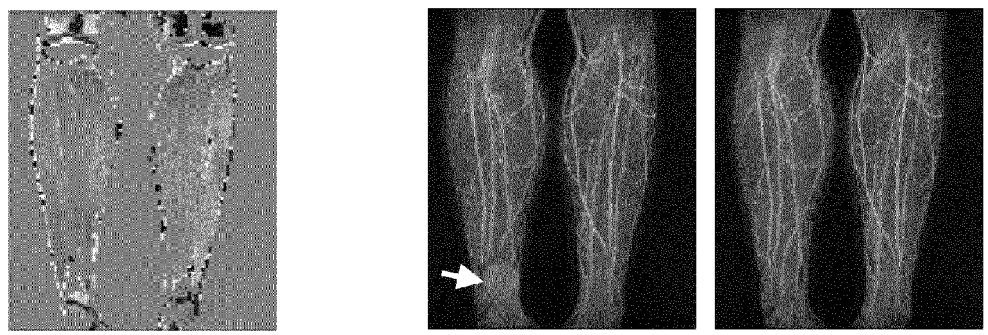
FIG. 4 shows the phase of selected voxels of the single echo image after virtual shimming according to the invention.
FIG. 5 shows maximum intensity projections of water images reconstructed without (left) and with (right) virtual shimming according to the invention.

FIG. 4 shows the signal phase at the selected voxel positions of FIG. 3 after the demodulation step.

Finally, a water image is computed from the demodulated single echo images, wherein the echo time-dependent phase evolution of the demodulated signals is attributed to the frequency difference between water and fat hydrogen atoms and residual inhomogeneity (that might not have been fully compensated for by the virtual shimming procedure). The right image of FIG. 5 is a maximum intensity projection of the water images reconstructed with virtual shimming in accordance with the invention. The left image of FIG. 5 is reconstructed without virtual shimming. The left image shows undesirable water/fat swaps (indicated by the white arrow). These artifacts are no longer visible in the right image reconstructed in accordance with the invention.

The invention claimed is:

1. A method of magnetic resonance (MR) imaging of at least two chemical species having different MR spectra, the method comprising:
    a) generating echo signals at different echo times by subjecting an object positioned in a main magnetic field to an imaging sequence of radio frequency (RF) pulses and switched magnetic field gradients;
    b) acquiring the echo signals;
    c) correcting the acquired echo signals by virtual shimming, which comprises:
        reconstructing single echo images from the echo signals;
        selecting a number of voxel positions wherein the criterion for the selection of the voxel positions is that single echo images contain only signal contributions from one of the chemical species at respective voxel positions;
        fitting a given mathematical function, which reproduces the spatial variation of the main magnetic field, to an echo time-dependent phase evolution of the single echo image values at the selected voxel positions;
        demodulating the single echo images according to the spatial variation of the main magnetic field as reproduced by the mathematical function; and
    d) reconstructing a MR image, wherein signal contributions of the at least two chemical species are separated on the basis of the demodulated single echo images.

2. The method of claim 1, wherein the mathematical function is a polynomial in the spatial coordinates.

3. The method of claim 1, wherein the selection of the voxel positions involves elimination of voxels having a signal magnitude above a given maximum value and/or below a given minimum value.

4. The method of claim 1, wherein the selection of the voxel positions involves elimination of voxels showing a variation of the signal magnitude as a function of echo time above a given maximum value.

5. The method of claim 1, wherein a spectral model for the different chemical species is employed in the step of separating the contributions of the different chemical species.

6. A magnetic resonance (MR) device for carrying out the method claimed in claim 1, which MR device includes
    at least one main magnet coil for generating a uniform, steady main magnetic field $B_0$ within an examination volume,
    a number of gradient coils for generating switched magnetic field gradients in different spatial directions within the examination volume,
    at least one RF coil for generating radio frequency (RF) pulses within the examination volume and/or for receiving MR signals from an object positioned in the examination volume,
    a control unit for controlling the temporal succession of RF pulses and switched magnetic field gradients, and
    a reconstruction unit for reconstructing MR images from the received MR signals, wherein the MR device is arranged to perform the following steps:
    a) generating echo signals at different echo times by subjecting an object positioned in a main magnetic field to an imaging sequence of RF pulses and switched magnetic field gradients;
    b) acquiring the echo signals;
    c) correcting the acquired echo signals by virtual shimming, which comprises:
        reconstructing single echo images from the echo signals;
        selecting a number of voxel positions wherein a criterion for the selection of the voxel positions is that the single echo images contain only signal contributions from one of the chemical species at the respective voxel positions;
        fitting a given mathematical function, which reproduces spatial variation of the main magnetic field, to the echo time-dependent phase evolution of the single echo image values at the selected voxel positions;
        demodulating the single echo images according to the spatial variation of the main magnetic field as reproduced by the mathematical function; and d) reconstructing a MR image, wherein signal contributions of the at least two chemical species are separated on the basis of the demodulated single echo images.

7. A non-transitory computer readable medium carrying computer-readable instructions configured to be run on one or more processors of a magnetic resonance (MR) device, wherein the computer-readable instructions are configured to control the MR device for:
a) generating echo signals at different echo times by running an imaging sequence of radio frequency (RF) pulses and switched magnetic field gradients;
b) acquiring the echo signals;
c) correcting the acquired echo signals by virtual shimming, which comprises:
reconstructing single echo images from the echo signals;
selecting a number of voxel positions wherein the criterion for the selection of the voxel positions is that the single echo images contain only signal contributions from one of the chemical species at the respective voxel positions;
fitting a given mathematical function, which reproduces spatial variation of the main magnetic field, to the echo time-dependent phase evolution of the single echo image values at the selected voxel positions;
demodulating the single echo images according to the spatial variation of the main magnetic field as reproduced by the mathematical function; and
d) reconstructing a MR image, wherein signal contributions of the at least two chemical species are separated on the basis of the demodulated single echo images.

8. The method of claim 1, further including displaying the reconstructed MR image on a display device.

9. The magnetic resonance device of claim 6, further including a display device, the reconstructed MR image being displayed on the display device.

10. The non-transitory computer-readable medium of claim 7, wherein the computer-readable instructions are further configured to control a display device configured to display the reconstructed MR image.

11. A magnetic resonance (MR) apparatus comprising:
at least one main magnet coil configured to generate a steady main magnetic field $B_0$ within an examination volume;
a plurality of gradient coils configured to generate switched magnetic field gradients in each of a plurality of spatial directions across the examination volume;
at least one RF coil configured to generate radio frequency (RF) pulses within the examination volume and/or to receive MR signals from an object positioned in the examination volume, the object including at least two chemical species;
one or more processors configured to control the plurality of gradient coils and the at least one RF coil to:
a) generate echo signals at selected echo times by subjecting the object positioned in the main magnetic field to an imaging sequence of RF pulses and switched magnetic field gradients, the echo signals of each chemical species undergoing a characteristic echo time-dependent phase evolution,
b) acquire the echo signals,
c) correct the acquired echo signals by virtual shimming, including:
reconstruct single echo images from the echo signals,
select a plurality of voxel positions in the single echo images that contain only echo signal contributions from one of the chemical species,
fit a mathematical function, which reproduces a spatial variation of the main magnetic field, to the echo time-dependent phase evolution of the single echo image values at the selected voxel position,
demodulate the single echo images according to the spatial variation of the main magnetic field as reproduced by the mathematical function; and
d) reconstruct MR images, each image depicting a distribution of one of the at least two chemical species on the basis of the demodulated single echo images.

12. The MR device of claim 11, further including:
a display device configured to display the reconstructed MR images.

13. A method of magnetic resonance (MR) imaging of water and fat having different MR spectra, the method comprising:
generating a plurality of phase-encoded echo signals at each of a plurality of different echo times, contributions of water and fat spins to the echo signals relative contributions evolving in phase with echo times in accordance with a difference in the MR spectrum of water and fat;
reconstructing single echo images, each single echo image being attributable to a different common echo time;
selecting voxels from the single echo images which are attributable only to water;
for the selected water only voxels, calculating time-dependent phase differences over the single echo image water only voxels;
fitting a linear or quadratic mathematical function along one or more orthogonal spatial directions to the time-dependent phase differences, the linear or quadratic mathematical function being indicative of a spatial variation of a steady main magnetic field $B_0$ along the one or more spatial directions to generate a $B_0$ field map;
demodulating the single echo images with the $B_0$ field map to remove main magnetic field inhomogenity influences on the echo time-dependent phase evolution of all voxel positions;
computing at least a water image from the demodulated single echo images wherein the echo time-dependent phase evolution of the demodulated signals is attributable to a frequency difference between resonating hydrogen atoms in water and fat; and
displaying at least the computed water image on a display device.

* * * * *